(12) United States Patent
Cholewa et al.

(10) Patent No.: US 9,385,437 B2
(45) Date of Patent: *Jul. 5, 2016

(54) DISC COMPRISING AN ELECTRICAL CONNECTION ELEMENT

(75) Inventors: Harald Cholewa, Aachen (DE);
Andreas Schlarb, Herzogenrath (DE);
Lothar Lesmeister, Landgraaf (NL);
Mitja Rateiczak, Wuerselen (DE);
Bernhard Reul, Herzogenrath (DE);
Lothar Schmidt, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 341 days.

This patent is subject to a terminal disclaimer.

(21) Appl. No.: 13/695,426

(22) PCT Filed: Jul. 4, 2011

(86) PCT No.: PCT/EP2011/061195
§ 371 (c)(1),
(2), (4) Date: Oct. 30, 2012

(87) PCT Pub. No.: WO2012/007303
PCT Pub. Date: Jan. 19, 2012

(65) Prior Publication Data
US 2013/0043066 A1    Feb. 21, 2013

(30) Foreign Application Priority Data

Jul. 13, 2010  (EP) ..................... 10169372

(51) Int. Cl.
*H01R 4/02* (2006.01)
*H01R 43/20* (2006.01)
(Continued)

(52) U.S. Cl.
CPC ............. *H01R 4/023* (2013.01); *B23K 1/002* (2013.01); *B23K 1/06* (2013.01); *B23K 35/262* (2013.01);
(Continued)

(58) Field of Classification Search
CPC .... B23K 35/264; B23K 35/262; B23K 1/002;
B23K 1/004; B23K 1/06; B23K 1/20; B23K 35/36; B32B 15/018; C22C 12/00; C22C 13/00; C22C 38/08; C22C 38/10; H01R 13/03; H01R 2201/02; H01R 2201/26; H01R 4/028; H01R 4/02; H01R 4/10; H01R 4/28; H01R 43/20; H01R 43/256; H05B 2203/016; H05B 3/84; H05B 2203/017; H05K 3/84; H05K 3/341; H05K 3/3463; H05K 3/3494; H05K 3/4015; H05K 2201/02; H05K 2201/26; H05K 2201/1028; H05K 2201/1031; H05K 2201/1034
USPC .................. 174/255–263, 546; 361/777, 760; 257/678, 782
See application file for complete search history.

(56) References Cited

U.S. PATENT DOCUMENTS 2,062,335 A * 12/1936 Scott ............................. 313/317
2,644,066 A    6/1953 Glynn
(Continued)

FOREIGN PATENT DOCUMENTS

CN    101 244 686 A    8/2008
DE    1936780          2/1970
(Continued)

OTHER PUBLICATIONS

Non-Final Office Action mailed on Mar. 7, 2014 for U.S. Appl. No. 13/575,566, filed Jul. 26, 2012 in the name of Stefan Ziegler et al.
(Continued)

*Primary Examiner* — Ishwarbhai B. Patel
*Assistant Examiner* — Paresh Paghadal
(74) *Attorney, Agent, or Firm* — Steinfl & Bruno LLP

(57) ABSTRACT

A pane with an electrical connection element is described. The pane can have a glass substrate and an electrically conductive structure on the substrate. Solder material can be used to electrically connect a connection element to the electrically conductive structure.

12 Claims, 7 Drawing Sheets

(51) Int. Cl.
- *B23K 1/002* (2006.01)
- *B23K 35/36* (2006.01)
- *H01R 43/16* (2006.01)
- *B23K 1/06* (2006.01)
- *H05B 3/84* (2006.01)
- *B23K 35/26* (2006.01)
- *H05K 3/34* (2006.01)

(52) U.S. Cl.
CPC ............... *B23K 35/36* (2013.01); *H01R 43/16* (2013.01); *H01R 43/20* (2013.01); *H05B 3/84* (2013.01); *B23K 35/264* (2013.01); *H01R 4/02* (2013.01); *H05B 2203/016* (2013.01); *H05B 2203/017* (2013.01); *H05K 3/341* (2013.01); *H05K 2201/02* (2013.01)

(56) References Cited

U.S. PATENT DOCUMENTS

| | | | |
|---|---|---|---|
| 2,709,211 A | | 5/1955 | Glynn |
| 3,088,833 A | * | 5/1963 | Pirooz ............... 501/76 |
| 3,484,584 A | | 12/1969 | Shaw, Jr |
| 6,406,337 B1 | * | 6/2002 | Machado .............. 439/876 |
| 6,787,700 B2 | | 9/2004 | Nagao et al. |
| 7,974,104 B2 | | 7/2011 | Kitada et al. |
| 2002/0102886 A1 | * | 8/2002 | Costa .............. 439/746 |
| 2002/0111081 A1 | | 8/2002 | Machado |
| 2003/0030064 A1 | | 2/2003 | Takano et al. |
| 2003/0073349 A1 | | 4/2003 | Nagao et al. |
| 2005/0029666 A1 | | 2/2005 | Kurihara et al. |
| 2006/0228953 A1 | * | 10/2006 | Pereira et al. ........... 439/876 |
| 2007/0031279 A1 | | 2/2007 | Soga et al. |
| 2007/0105412 A1 | * | 5/2007 | Hoepfner et al. ............ 439/83 |
| 2007/0224842 A1 | * | 9/2007 | Hoepfner et al. ............ 439/34 |
| 2009/0277671 A1 | | 11/2009 | Hahn |
| 2011/0056589 A1 | | 3/2011 | De Boer et al. |
| 2012/0298416 A1 | | 11/2012 | Ziegler et al. |
| 2012/0318566 A1 | | 12/2012 | Reul et al. |
| 2013/0043066 A1 | | 2/2013 | Cholewa et al. |

FOREIGN PATENT DOCUMENTS

| | | |
|---|---|---|
| DE | 102006017675 | 10/2007 |
| EP | 0488878 | 6/1992 |
| EP | 0720253 | 7/1996 |
| EP | 0848449 | 6/1998 |
| EP | 1488972 | 12/2004 |
| EP | 1942703 | 7/2008 |
| EP | 2367399 | 9/2011 |
| FR | 1104595 | 11/1955 |
| GB | 751536 | 6/1956 |
| JP | 56-78170 U | 6/1981 |
| JP | H09 139 565 A | 5/1997 |
| JP | H10 163 355 A | 6/1998 |
| JP | H11 306 862 A | 11/1999 |
| WO | 98/47200 | 10/1998 |
| WO | 2004/012302 A1 | 2/2004 |
| WO | 2009/135469 A1 | 11/2009 |

OTHER PUBLICATIONS

Notice of Allowance mailed on Jul. 7, 2014 for U.S. Appl. No. 13/575,566, filed Jul. 26, 2012 in the name of Stefan Ziegler et al.
Non-Final Office Action mailed on Mar. 14, 2014 for U.S. Appl. No. 13/580,741, filed Aug. 23, 2012 in the name of Bernhard Reul et al.
Notice of Allowance mailed on Jul. 8, 2014 for U.S. Appl. No. 13/580,741, filed Aug. 23, 2012 in the name of Bernhard Reul et al.
International Preliminary Report on Patentability issued on Jan. 15, 2013 for International Application No. PCT/EP2011/061195 filed on Jul. 4, 2011 in the name of Saint-Gobain Glass France (English and German).
PCT International Search Report mailed on May 12, 2011 for PCT/EP2011/052195 filed on Feb. 15, 2011 in the name of Saint-Gobain Glass France (German and English).
PCT Written Opinion mailed on May 12, 2012 for PCT/EP2011/052195 filed on Feb. 15, 2011 in the name of Saint-Gobain Glass France (German and English).
PCT International Preliminary Report on Patentability mailed on Sep. 25, 2012 for PCT/EP2011/052195 filed on Feb. 15, 2011 in the name of Saint-Gobain Glass France (German and English).
PCT International Search Report mailed on May 17, 2012 for PCT/EP2011/052196 filed on Feb. 15, 2011 in the name of SaintGobain Glass France (German and English).
PCT Written Opinion mailed on May 17, 2012 for PCT/EP2011/052196 filed on Feb. 15, 2011 in the name of Saint-Gobain Glass France (German and English).
PCT International Preliminary Report on Patentability mailed on Sep. 25, 2012 for PCT/EP2011/052196 filed on Feb. 15, 2011 in the name of Saint-Gobain Glass France (German and English).
PCT International Search Report mailed Sep. 26, 2011 for PCT/EP2011/061195 filed on Jul. 4, 2011 in the name of Saint-Gobain Glass France.
PCT Written Opinion mailed on Jan. 15, 2013 for PCT/EP2011/061195 filed on Jul. 4, 2011 in the name of Saint-Gobain Glass France. (German + English).

* cited by examiner

DISC COMPRISING AN ELECTRICAL CONNECTION ELEMENT

CROSS REFERENCE TO RELATED APPLICATIONS

The present application is the U.S. national stage entry of International Application PCT/EP2011/061195 filed on Jul. 4, 2011, which in turn claims priority to European Patent Application 10169372.9, filed on Jul. 13, 2010.

BACKGROUND

The invention relates to a pane with an electrical connection element and an economical and environmentally friendly method for its production.

The invention further relates to a pane with an electrical connection element for motor vehicles with electrically conductive structures such as, for instance, heating conductors or antenna conductors. The electrically conductive structures are customarily connected to the on-board electrical system via soldered-on electrical connection elements. Due to different coefficients of thermal expansion of the materials used, mechanical stresses occur during production and operation that strain the panes and can cause breakage of the pane.

FIELD

Lead-containing solders have high ductility that can compensate the mechanical stresses occurring between an electrical connection element and the pane by plastic deformation. However, because of the End of Life Vehicles Directive 2000/53/EC, lead-containing solders have to be replaced by lead-free solders within the EC. The directive is referred to, in summary, by the acronym ELV (End of Life Vehicles). The objective is to ban extremely problematic components from products resulting from the massive increase in disposable electronics. The substances affected are lead, mercury, cadmium, and chromium. This relates, among other things, to the implementation of lead-free soldering materials in electrical applications on glass and the introduction of corresponding replacement products.

EP 1 942 703 A2 discloses an electrical connection element on panes of motor vehicles, wherein the difference in the coefficient of thermal expansion of a pane and an electrical connection element is $<5\times10^{-6}/°$ C. In order to enable adequate mechanical stability and processability, it is proposed to use an excess of solder material. The excess of solder material flows out from the intermediate space between the connection element and the electrically conductive structure. The excess of solder material causes high mechanical stresses in the glass pane. These mechanical stresses ultimately result in breakage of the pane.

SUMMARY

The object of the present invention is to provide a pane with an electrical connection element and an economical and environmentally friendly method for its production, whereby critical mechanical stresses in the pane are avoided.

The object of the present invention is accomplished by a pane with a connection element that comprises the following characteristics:
  a substrate made of glass,
  an electrically conductive structure with a layer thickness of 5 μm to 40 μm on a region of the substrate,
  a connection element, and
  a layer of a solder material which electrically connects the connection element to a portion of the electrically conductive structure, wherein
  the connection element contains at least one iron-nickel alloy or one iron-nickel-cobalt alloy,
  the connection element is connected to the portion of the electrically conductive structure via a contact surface over its entire surface, and
  the contact surface has no corners.

An electrically conductive structure is applied on the pane. An electrical connection element is electrically connected to the electrically conductive structure by a soldering material on portions. The solder material flows out with an outflow width of <1 mm from the intermediate space between the connection element and the electrically conductive structure.

In a preferred embodiment, the maximum outflow width is less than 0.5 mm and, in particular, roughly 0 mm. The maximum outflow width can even be negative, i.e., pulled back into the intermediate space formed by an electrical connection element and an electrically conductive structure, preferably in a concave meniscus.

The maximum outflow width is defined as the distance between the outer edges of the connection element and the point of the solder material crossover, at which the solder material drops below a layer thickness of 50 μm.

The advantage resides in the reduction of mechanical stresses in the pane, in particular, in the critical region present with a large solder material crossover.

The first coefficient of thermal expansion is preferably from $8\times10^{-6}/°$ C. to $9\times10^{-6}/°$ C. The substrate is preferably glass that has, preferably, a coefficient of thermal expansion from $8.3\times10^{-6}/°$ C. to $9\times10^{-6}/°$ C. in a temperature range from 0° C. to 300° C.

The second coefficient of thermal expansion is preferably from $8\times10^{-6}/°$ C. to $9\times10^{-6}/°$ C., particularly preferably from $8.3\times10^{-6}/°$ C. to $9\times10^{-6}/°$ C. in a temperature range from 0° C. to 300° C.

The coefficient of thermal expansion of the connection element can be $\leq 4\times10^{-6}/°$ C.

The electrically conductive structure according to the invention has, preferably, a layer thickness of 8 μm to 15 μm, particularly preferably of 10 μm to 12 μm. The electrically conductive structure according to the invention contains, preferably, silver, particularly preferably, silver particles and glass frits.

The layer thickness of the solder according to the invention is preferably $<7.0\times10^{-4}$ m, particularly preferably $<3.0\times10^{-4}$ m, and, in particular, $<0.5\times10^{-4}$ m. The solder material according to the invention contains, preferably, tin and bismuth, indium, zinc, copper, silver, or compositions thereof. The proportion of tin in the solder composition according to the invention is from 3 wt.-% to 99.5 wt.-%, preferably from 10 wt.-% to 95.5 wt.-%, particularly preferably from 15 wt.-% to 60 wt.-%. The proportion of bismuth, indium, zinc, copper, silver, or compositions thereof in the solder composition according to the invention is from 0.5 wt.-% to 97 wt.-%, preferably 10 wt.-% to 67 wt.-%, whereby the proportion of tin, bismuth, indium, zinc, copper, or silver can be 0 wt.-%. The solder composition according to the invention can contain nickel, germanium, aluminum, or phosphorus at a proportion of 0 wt.-% to 5 wt.-%. The solder composition according to the invention contains, very particularly preferably, Bi57Sn42Ag1, Bi59Sn40Ag1, In97Ag3, Sn95.5Ag3.8Cu0.7, Bi67In33, Bi33In50Sn17, Sn77.2In20Ag2.8, Sn95Ag4Cu1, Sn99Cu1, Sn96.5Ag3.5, or mixtures thereof. The solder material according to the invention is preferably lead free and contains no lead or only production-related admixtures of lead.

The connection element according to the invention contains preferably at least 50 wt.-% to 75 wt.-% iron, 25 wt.-% to 50 wt.-% nickel, 0 wt.-% to 20 wt.-% cobalt, 0 wt.-% to 1.5 wt.-% magnesium, 0 wt.-% to 1 wt.-% silicon, 0 wt.-% to 1 wt.-% carbon, or 0 wt.-% to 1 wt.-% manganese.

The connection element according to the invention contains preferably chromium, niobium, aluminum, vanadium, tungsten, and titanium at a proportion of 0 wt.-% to 1 wt.-%, molybdenum at a proportion of 0 wt.-% to 5 wt.-%, as well as production-related admixtures.

The connection element according to the invention contains preferably at least 55 wt.-% to 70 wt.-% iron, 30 wt.-% to 45 wt.-% nickel, 0 wt.-% to 5 wt.-% cobalt, 0 wt.-% to 1 wt.-% magnesium, 0 wt.-% to 1 wt.-% silicon, or 0 wt.-% to 1 wt.-% carbon.

The connection element according to the invention further contains preferably at least 50 wt.-% to 60 wt.-% iron, 25 wt.-% to 35 wt.-% nickel, 15 wt.-% to 20 wt.-% cobalt, 0 wt.-% to 0.5 wt.-% silicon, 0 wt.-% to 0.1 wt.-% carbon, or 0 wt.-% to 0.5 wt.-% manganese.

The connection element according to the invention is, particularly preferably, partially coated, with nickel, tin, copper, and/or silver. The connection element according to the invention is, very particularly preferably, coated with 0.1 µm to 0.3 µm nickel and/or 3 µm to 10 µm silver. The connection element can be plated with nickel, tin, copper, and/or silver. Ni and Ag improve the current carrying capacity and corrosion stability of the connection element and the wetting with the solder material.

The connection element according to the invention contains preferably kovar (FeCoNi) and/or invar (FeNi) with a coefficient of thermal expansion of invar of $0.1 \times 10^{-6}/°C$ to $4 \times 10^{-6}/°C$ or a maximum difference of kovar of $5 \times 10^{-6}/°C$ to the coefficient of expansion of the pane.

Kovar is an iron-nickel-cobalt alloy that has a coefficient of thermal expansion of usually roughly $5 \times 10^{-6}/°C$, which is thus less than the coefficient of typical metals. The composition contains, for example, 54 wt.-% iron, 29 wt.-% nickel, and 17 wt.-% cobalt. In the area of microelectronics and microsystem technology, kovar is, consequently, used as a housing material or as a submount. Submounts lie, according to the sandwich principle, between the actual carrier material and the material with, for the most part, a clearly greater coefficient of expansion. Kovar thus serves as a compensating element which absorbs and reduces the thermo-mechanical stresses caused by the different coefficients of thermal expansion of the other materials. Similarly, kovar is used for metal-glass implementations of electronic components and material transitions in vacuum chambers.

Invar is an iron-nickel alloy with a content of, for example, 36 wt.-% nickel (FeNi36). There is a group of alloys and compounds that have the property of having abnormally small or sometimes negative coefficients of thermal expansion in certain temperature ranges. Fe65Ni35 invar contains 65 wt.-% iron and 35 wt.-% nickel. Up to 1 wt.-% magnesium, silicon, and carbon are usually alloyed to change the mechanical properties. By alloying 5 wt.-% cobalt, the coefficient of thermal expansion a can be further reduced. One name for the alloy is Inovco, FeNi33Cu4.5 with an coefficient of expansion $\alpha$ (20° C. to 100° C.) of $0.55 \times 10^{-6}/°C$.

If an alloy such as invar with a very low absolute coefficient of thermal expansion of $<4 \times 10^{6}/°C$ is used, overcompensation of mechanical stresses occurs through noncritical pressure stresses in the glass or through noncritical tensile stresses in the alloy.

The connection element according to the invention contains preferably iron-nickel alloys and/or iron-nickel-cobalt-alloys post-treated thermally by annealing.

Kovar and/or invar can also be welded, crimped, or glued as a compensation plate onto a connection element made, for example, of steel, aluminum, titanium, copper. As a bimetal, favorable expansion behavior of the connection element relative to the glass expansion can be obtained. The compensation plate is preferably hat-shaped.

The electrical connection element contains, on the surface facing the solder material, a coating that contains copper, zinc, tin, silver, gold, or a combination thereof, preferably silver. This prevents a spreading of the solder material out beyond the coating and limits the outflow width.

The electrical connection element is connected over its entire surface to a portion of the electrically conductive structure via a contact surface. Moreover, the contact surface of the connection element has no corners. The contact surface can have an oval, preferably an elliptical, and, in particular, a circular structure. Alternatively, the contact surface can have a convex polygonal shape, preferably a rectangular shape, with rounded corners. The rounded corners have a radius of curvature of r>0.5 mm, preferably of r>1 mm.

The maximum dimensions of the connection elements are, in the plan view, for example, preferably 1 mm to 50 mm long and wide and, particularly preferably 3 mm to 30 mm long and wide and, very particularly preferably 2 mm to 4 mm wide and 12 mm to 24 mm long.

The shape of the electrical connection element can form solder depots in the intermediate space of the connection element and the electrically conductive structure. The solder depots and wetting properties of the solder on the connection element prevent the outflow of the solder material from the intermediate space. Solder depots can be rectangular, rounded, or polygonal in design.

The distribution of the soldering heat and, thus, the distribution of the solder material during the soldering process can be defined by the shape of the connection element. Solder material flows to the warmest point. The introduction of energy during the electrical connecting of an electrical connection and an electrically conductive structure occurs preferably by means of punch soldering, thermode soldering, piston soldering, preferably laser soldering, hot air soldering, induction soldering, resistance soldering, and/or with ultrasound.

The object of the invention is further accomplished through a method for producing a pane with a connection element, wherein a) solder material is disposed and applied on the connection element as a platelet with a fixed layer thickness, volume, shape, and arrangement, b) an electrically conductive structure is applied on a substrate, c) the connection element with the solder material is disposed on the electrically conductive structure, and d) the connection element is soldered to the electrically conductive structure.

The solder material is preferably applied in advance to the connection elements, preferably as a platelet with a fixed layer thickness, volume, shape, and arrangement on the connection element.

The connection element is welded or crimped to a (partially not shown) sheet, braided wire, mesh. made, for example, of copper and connected to the on-board electrical system (also not shown).

The connection element is preferably used in heated panes or in panes with antennas in buildings, in particular in automobiles, railroads, aircraft, or watercraft. The connection element serves to connect the conducting structures of the pane to electrical systems that are disposed outside the pane. The electrical systems are amplifiers, control units, or voltage sources.

BRIEF DESCRIPTION OF THE DRAWINGS

The invention is explained in detail with reference to drawings and exemplary embodiments. They depict.

DETAILED DESCRIPTION

Figure 1:
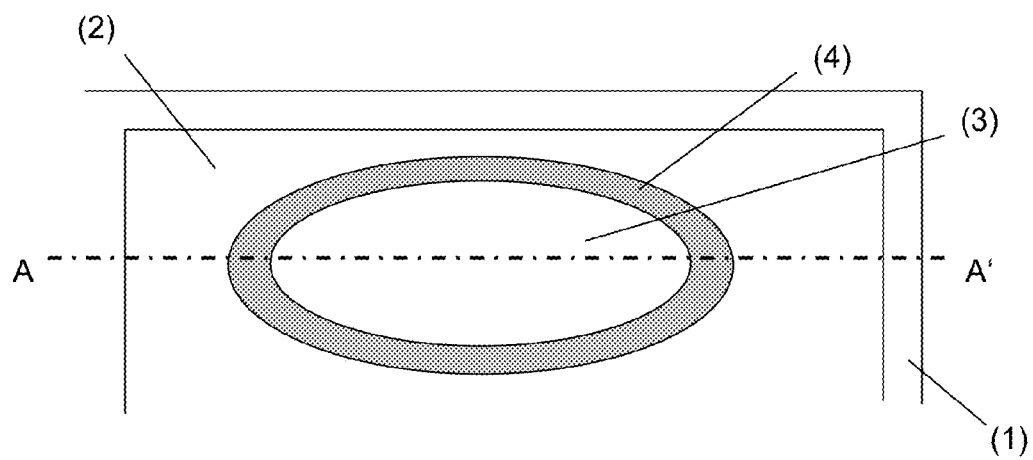
FIG. 1 a plan view of a pane according to the invention with an elliptical connection element, FIG. 2 a cross-section A-A' through the pane of FIG. 1, FIG. 3 a cross-section through an alternative pane according to the invention, FIG. 4 a cross-section through another alternative pane according to the invention, FIG. 5 a plan view of an alternative embodiment of the connection element, FIG. 6 a plan view of another alternative embodiment of the connection element, FIG. 7 a plan view of another alternative embodiment of the connection element, FIG. 8 a side view of the connection element of FIG. 7, FIG. 9 a cross-section through another alternative pane according to the invention with an arched connection element, FIG. 10 a detailed flow chart of the method according to the invention, and FIG. 11 a spatial representation of a connection element in the form of a bridge.
Figure 2:
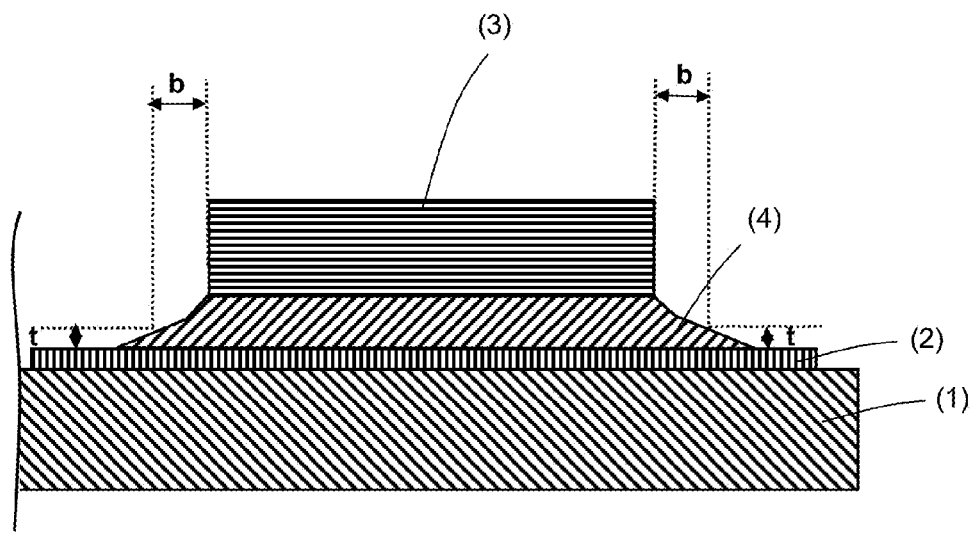

FIG. 1 and FIG. 2 show, in each case, a detail of a heatable pane 1 according to the invention in the region of the electrical connection element 3. The pane 1 is a 3-mm-thick thermally prestressed single-pane safety glass made of soda-lime glass. The pane 1 has a width of 150 cm and a height of 80 cm. An electrically conductive structure 2 in the form of a heating conductor structure 2 is printed on the pane 1. The electrically conductive structure 2 contains silver particles and glass frits. In the edge region of the pane 1, the electrically conductive structure 2 is widened to a width of 10 mm and forms a contact surface for the electrical connection element 3. In the edge region of the pane 1, a covering screen print (not shown) is also situated. In the region of the contact surface between the electrical connection element 3 and the electrically conductive structure 2, solder material 4 is applied, which effects a durable electrical and mechanical connection between the electrical connection element 3 and the electrically conductive structure 2.

The solder material 4 contains 57 wt.-% bismuth, 42 wt.-% tin, and 1 wt.-% silver. The solder material 4 is disposed through a predefined volume and shape completely between the electrical connection element 3 and the electrically conductive structure 2. The solder material 4 has a thickness of 250 μm. An outflow of the solder material 4 from the intermediate space between the electrical connection element 3 and the electrically conductive structure 2, which exceeds a layer thickness t of 50 μm, is observed to a maximum outflow width of b=0.5 mm. The electrical connection element 3 is an alloy that contains 54 wt.-% iron, 29 wt.-% nickel, and 17 wt.-% cobalt. The electrical connection element 3 is designed with an elliptical base surface. The length of the major axis is 12 mm; the length of the minor axis, 5 mm. The material thickness of the connection element 3 is 0.8 mm. No critical mechanical stresses are observed in the pane 1 due to the arrangement of the solder material 4, predefined by the connection element 3 and the electrically conductive structure 2. The connection of the pane 1 to the electrical connection element 3 via the electrically conductive structure 2 is durably stable.

Figure 3:
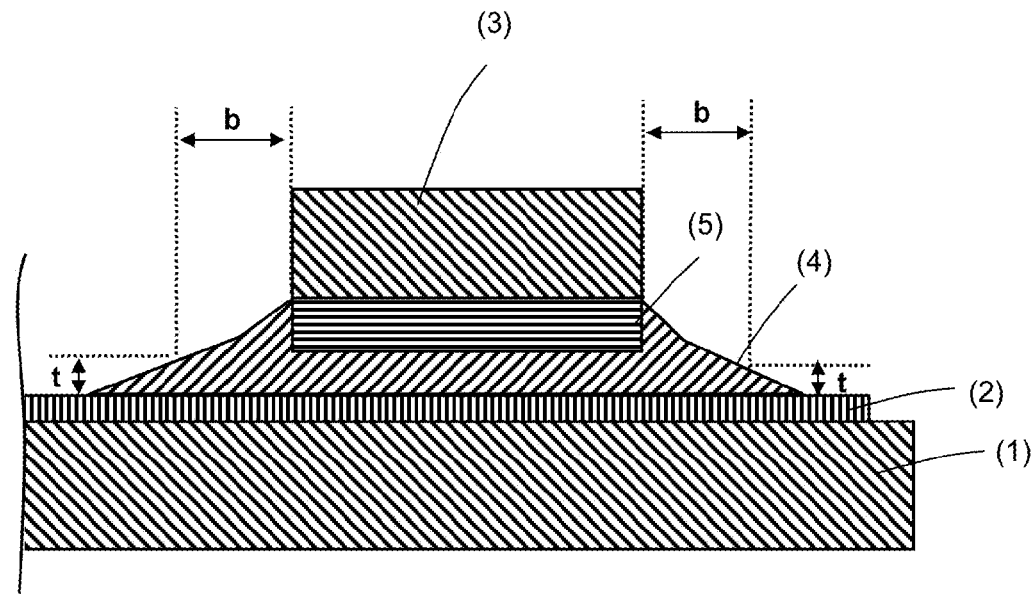

FIG. 3 depicts, in continuation of the exemplary embodiment of FIGS. 1 and 2, an alternative embodiment of the connection element 3 according to the invention. The electrical connection element 3 is provided on the surface facing the solder material 4 with a silver-containing coating 5. This prevents spreading of the solder material out beyond the coating 5 and limits the outflow width b. The outflow width b of the solder material 4 is less than 1 mm. No critical mechanical stresses are observed in the pane 1 due to the arrangement of the solder material 4. The connection of the pane 1 to the electrical connection element 3 via the electrically conductive structure 2 is durably stable.

Figure 4:
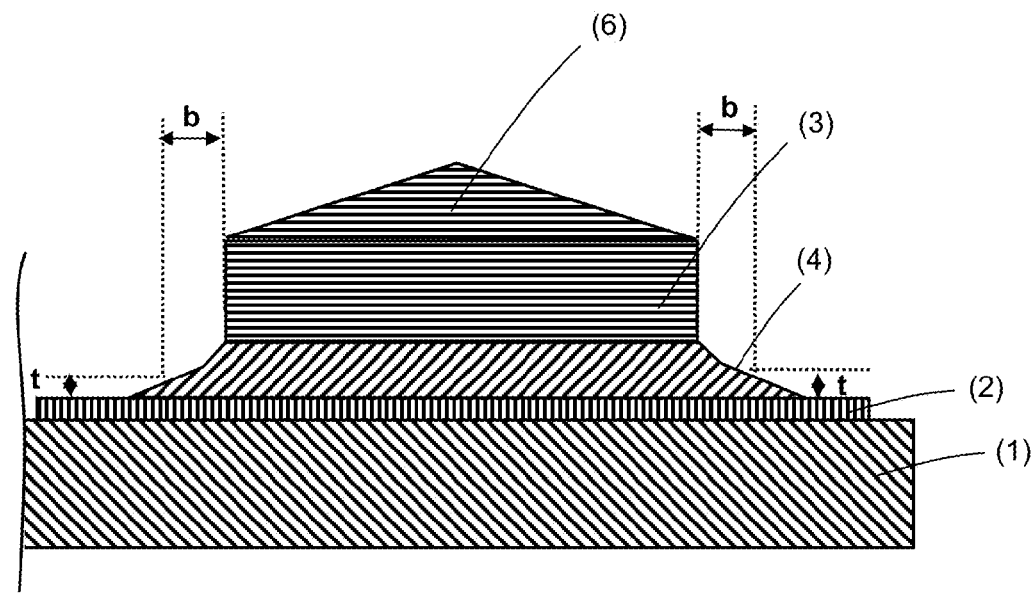

FIG. 4 depicts another embodiment of the pane 1 according to the invention with a connection element 3 with an elliptical base surface. The connection element 3 contains an iron-containing alloy with a coefficient of thermal expansion of $8 \times 10^{-6}/°C$. The material thickness is 2 mm. In the region of the contact surface of the connection element 3 with the pane 1, a hat-shaped compensation member 6 with an iron-nickel-cobalt alloy is applied. The maximum layer thickness of the hat-shaped compensation member 6 is 4 mm. By means of the compensation member, it is possible to adapt the coefficients of thermal expansion of the connection element 3 to the requirements of the pane 1 and of the solder material 4. The hat-shaped compensation member 6 results in improved heat flow during the production of the solder connection 4. The heating occurs primarily in the center of the contact surface. It is possible to further reduce the outflow width b of the solder material 4. Because of the low outflow width b of <1 mm and the adapted coefficient of expansion, it is possible to further reduce the thermal stresses in the pane 1. The thermal stresses in the pane 1 are noncritical, and a durable electrical and mechanical connection is provided between the connection element 3 and the pane 1 via the electrically conductive structure 2.

Figure 5:
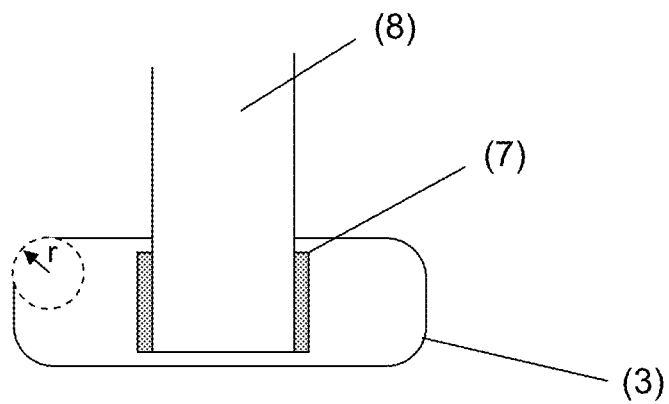

FIG. 5 depicts a plan view of an alternative embodiment of the connection element 3 according to the invention. The connection element 3 is designed as a rectangle and has a width of 5 mm and a length of 14 mm. The corners of the rectangle are in each case rounded with a circular segment with a radius of curvature r of 1 mm, for example. Furthermore, a connection cable 8 is welded via a welding region 7 to the connection element 3. The welding region 7 has a width of 3 mm and a length of 6 mm. The connection cable 8 is a woven cable made of thin, tin-plated copper wires. Stranded wire cables or wires can also be used as the connection cable 8. Alternatively, metal sleeves, plug connectors, or crimp connections can also be electrically conductively connected to the connection element 3. In particular, the connection element 3 can also be designed as a one-piece or multi-piece clamping sleeve or crimp element.

Figure 6:
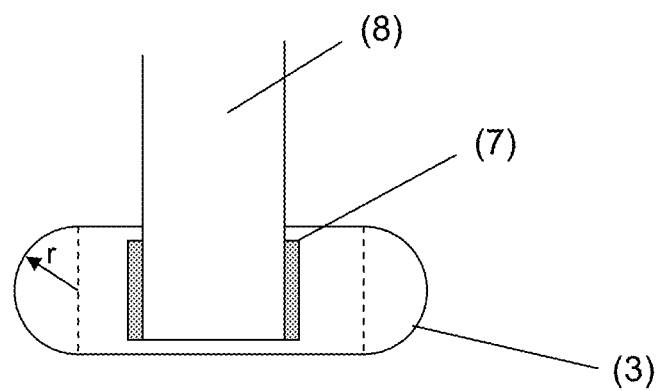

FIG. 6 depicts a plan view of another embodiment of the connection element 3 according to the invention. The connection element 3 is designed as a rectangle, with the two short sides of the rectangle designed as semicircles. The connection element has a width of 5 mm and a length of 14 mm. The welding region 7 has a width of 3 mm and a length of 6 mm.

Figure 7:
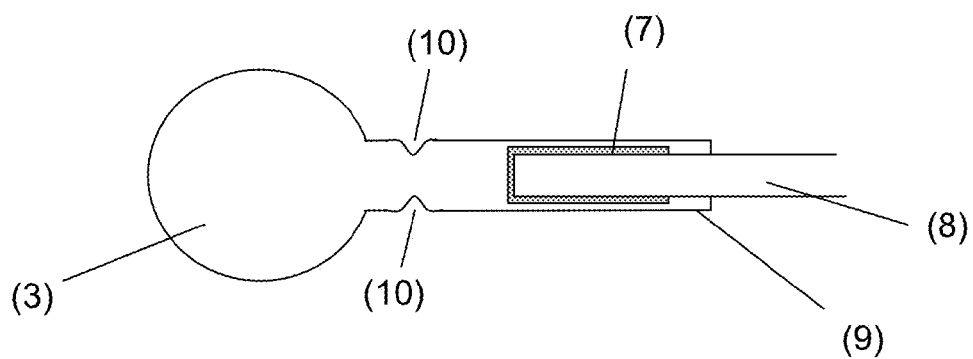
Figure 8:
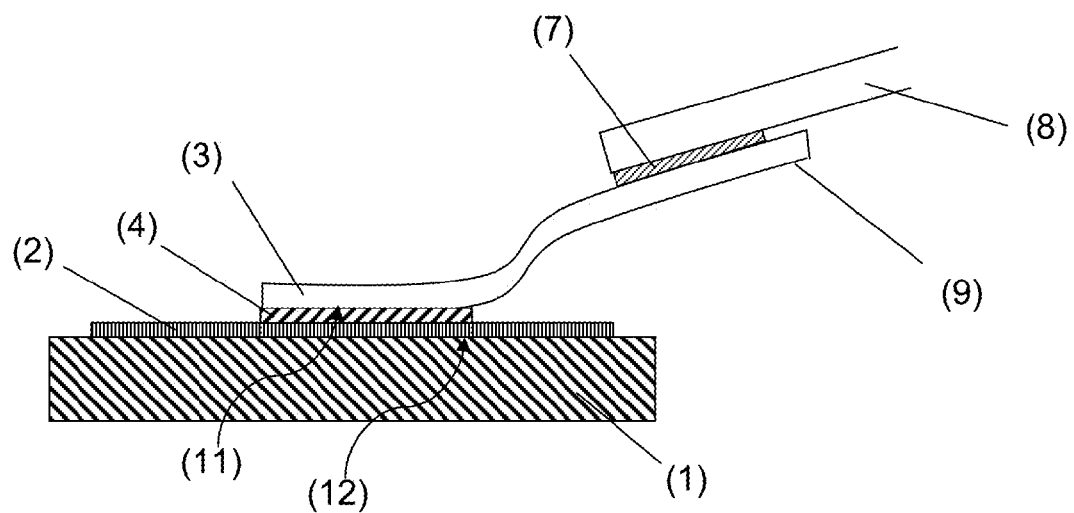

FIG. 7 and FIG. 8 depict another embodiment of the connection element 3 according to the invention with a connecting tab 9. The contact surface 11 of the connection element 3 is designed as a circle. The radius of the circle is 4 mm. The connecting tab 9 is connected via a welding region 7 to a connection cable 8. Alternatively, the connecting tab 9 can also be designed as a flat plug as well as a clamping sleeve or crimp connector. The connecting tab 9 has, in this embodiment, two notches 10, 10'. These notches 10, 10' serve to reduce the material of the connecting tab 9. This results in a spring effect and thus in the mitigation of forces that are transferred via the connection cable 8 to the solder contact.

Figure 9:
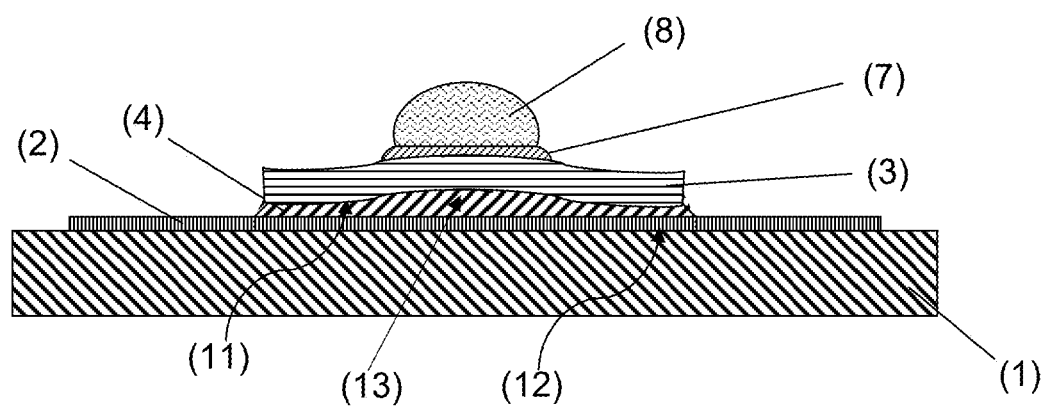

FIG. 9 depicts a cross-section through another embodiment of a connection element 3 according to the invention. The connection element 3 has an arch 13 in the center. In the region of the curve 13, the solder material 4 is thickened.

Figure 10:
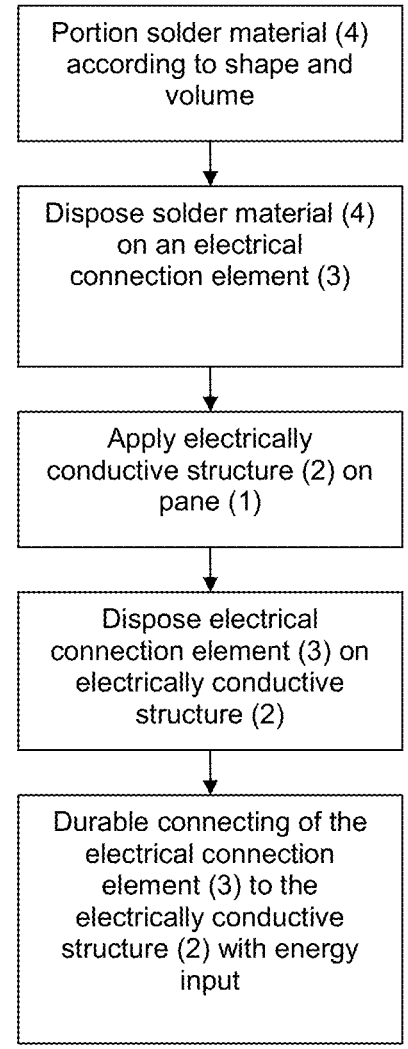

FIG. 10 depicts in detail an example of the method according to the invention for producing a pane with an electrical connection element 3. As a first step, it is necessary to portion the solder material 4 according to shape and volume. The portioned solder material 4 is disposed on the electrical connection element 3. The electrical connection element 3 is disposed with the solder material 4 on the electrically conductive structure 2. A durable connection of the electrical connection element 3 to the electrically conductive structure 2 and, thus, to the pane 1 takes place through the input of energy.

EXAMPLE

Test specimens were produced with the pane 1 (thickness 3 mm, width 150 cm, and height 80 cm), with the electrically conductive structure 2 in the form of a heating conductor structure, the electrical connection element 3, the silver layer on the contact surfaces of the connection element 3, and the solder material 4. The solder material 4 was applied in advance as a platelet with fixed layer thickness, volume, and shape on the contact surface 11 of the connection element 3. The connection element 3 was applied with the solder material 4 applied on the electrically conductive structure 2. The connection element was soldered onto the electrically conductive structure 2 at a temperature of 200° C. and a processing time of 2 seconds. Outflow of the solder material 4 from the intermediate space between the electrical connection element 3 and the electrically conductive structure 2, which exceeded a layer thickness t of 50 μm, was observed only to a maximum outflow width of b=0.5 mm. The dimensions and compositions of the electrically conductive structure 2, the electrical connection element 3, the silver layer on the contact surfaces of the connection element 3, and the solder material 4 are found in Table 1 and FIGS. 1 and 2 and the description of the figures.

With all specimens, it was possible to observe, with a temperature difference from +80° C. to −30° C., that no glass substrate 1 broke or showed damage. It was possible to demonstrate that, shortly after soldering, these panes 1 with the soldered connection element 3 were stable against a sudden temperature drop.

In addition, test specimens were executed with a second composition of the electrical connection element 3. The dimensions and compositions of the electrically conductive structure 2, the electrical connection element 3, the silver layer on the contact surfaces of the connection element 3, and the solder material 4 detailed values are found in Table 2. Here as well, it was possible to observe that, with a temperature difference from +80° C. to −30° C., no glass substrate 1 broke or had damage. It was possible to demonstrate that, shortly after soldering, these panes 1 with the soldered connection element 3 were stable against a sudden temperature drop.

TABLE 1

| Components | Material | Example |
| --- | --- | --- |
| Connection element | Iron | 54 |
| | Nickel | 29 |
| | Cobalt | 17 |
| | CTE (coefficient of thermal expansion) × $10^{-6}$ (0° C.-100° C.) | 5.1 |
| | Difference between CTE of the connection element and substrate × $10^{-6}/°$ C. (0° C.-100° C.) | 3.2 |
| | Thickness of the connection element (m) | $8.0 \times 10^{-4}$ |
| Solderable layer | Silver | 100 |
| | Thickness of the layer (m) | $7.0 \times 10^{-6}$ |
| Solder layer | Tin | 42 |
| | Bismuth | 57 |
| | Silver | 1 |
| | Thickness of the solder layer in (m) | $250 \times 10^{-6}$ |
| | The thickness of the solderable layer and the solder layer (m) | $255 \times 10^{-6}$ |
| Glass substrate (Soda lime glass) | CTE × $10^{-6}$ (0° C.-320° C.) | 8.3 |

TABLE 2

| Components | Material | Example |
| --- | --- | --- |
| Connection element | Iron | 65 |
| | Nickel | 35 |
| | CTE (coefficient of thermal expansion) × $10^{-6}$ (0° C.-100° C.) | 1.7 |
| | Difference between CTE of the connection element and substrate × $10^{-6}/°$ C. (0° C.-100° C.) | 6.6 |
| | Thickness of the connection element (m) | $8.0 \times 10^{-4}$ |
| Solderable layer | Silver | 100 |
| | Thickness of the layer (m) | $7.0 \times 10^{-6}$ |
| Solder layer | Tin | 42 |
| | Bismuth | 57 |
| | Silver | 1 |
| | Thickness of the solder layer in (m) | $250 \times 10^{-6}$ |
| | The thickness of the solderable layer and the solder layer (m) | $255 \times 10^{-6}$ |
| Glass substrate (Soda lime glass) | CTE × $10^{-6}$ (0° C.-320° C.) | 8.3 |

Comparative Example 1

The comparative example 1 was carried out the same as the example with the following differences: The dimensions and components of the electrically conductive structure 2, the electrical connection element 3, the metal layer on the contact surfaces of the connection element 3, and the solder material 4 are found in Table 3. The solder material 4 was, in accordance with the prior art, not applied in advance as a platelet on the contact surface of the connection element 3. The connection element 3 was soldered to the electrically conductive structure 2 in accordance with the conventional method. With the outflow of the solder material 4 from the intermediate space between the electrical connection element 3 and the electrically conductive structure 2, which exceeded a layer thickness t of 50 μm, an average outflow width b=2 mm to 3 mm was obtained.

With a sudden temperature difference from +80° C to −30° C, it was observed that the glass substrates 1 had major damage shortly after soldering.

TABLE 3

| Components | Material | Comparative Example 1 |
|---|---|---|
| Connection element | Titanium | 100 |
| | CTE (coefficient of thermal expansion) × $10^{-6}$ (0° C.-100° C.) | 8.80 |
| | Difference between CTE of the connection element and substrate × $10^{-6}$/° C. (0° C.-100° C.) | 0.5 |
| | Thickness of the connection element (m) | $8.0 \times 10^{-4}$ |
| Solderable layer | Silver | 100 |
| | Thickness of the layer (m) | $7.0 \times 10^{-6}$ |
| Solder layer | Tin | 48 |
| | Bismuth | 46 |
| | Silver | 2 |
| | Copper | 4 |
| | Thickness of the solder layer in (m) | $50\text{-}200 \times 10^{-6}$ |
| | The thickness of the solderable layer and the solder layer (m) | $55\text{-}205 \times 10^{-6}$ |
| Glass substrate (Soda lime glass) | CTE × $10^{-6}$ (0° C.-320° C.) | 8.3 |

Comparative Example 2

The comparative example 2 was carried out the same as the example with the following differences. The dimensions and components of the electrically conductive structure 2, the electrical connection element 3, the metal layer on the contact surfaces of the connection element 3, and the solder material 4 are found in Table 4. The solder material 4 was, in accordance with the prior art, not applied in advance as a platelet on the contact surface of the connection element 3. The connection element 3 was soldered to the electrically conductive structure 2 in accordance with the conventional method. With the outflow of the solder material 4 from the intermediate space between the electrical connection element 3 and the electrically conductive structure 2, which exceeded a layer thickness t of 50 μm, an average outflow width b=1 mm to 1.5 mm was obtained.

With a sudden temperature difference from +80° C to −30° C, it was observed that the glass substrates 1 had major damage shortly after soldering.

TABLE 4

| Components | Material | Comparative Example 2 |
|---|---|---|
| Connection element | Copper | 100 |
| | CTE (coefficient of thermal expansion) × $10^{-6}$ (0° C.-100° C.) | 16 |
| | Difference between CTE of the connection element and substrate × $10^{-6}$/° C. (0° C.-100° C.) | 7.7 |
| | Thickness of the connection element (m) | $8.0 \times 10^{-4}$ |
| Solderable layer | Silver | 100 |
| | Thickness of the layer (m) | $7.0 \times 10^{-6}$ |
| Solder layer | Tin | 71.5 |
| | Indium | 24 |
| | Silver | 2.5 |
| | Bismuth | 1.5 |
| | Copper | 0.5 |
| | Thickness of the solder layer in (m) | $50\text{-}200 \times 10^{-6}$ |
| | The thickness of the solderable layer and the solder layer (m) | $55\text{-}205 \times 10^{-6}$ |
| Glass substrate (Soda lime glass) | CTE × $10^{-6}$ (0° C.-320° C.) | 8.3 |

Usually, higher tensile stresses in the glass result in an increased risk of flaking or shell defects in the glass. Consequently, the influence of the contact surface 11 between the connection element 3 and the portion 12 of the electrically conductive structure 2 was investigated by computer simulations. The tensile stresses during the cooling of panes with connection elements of different geometries were calculated. The various connection elements were bridge-shaped (B) and circular (K).

Figure 11:
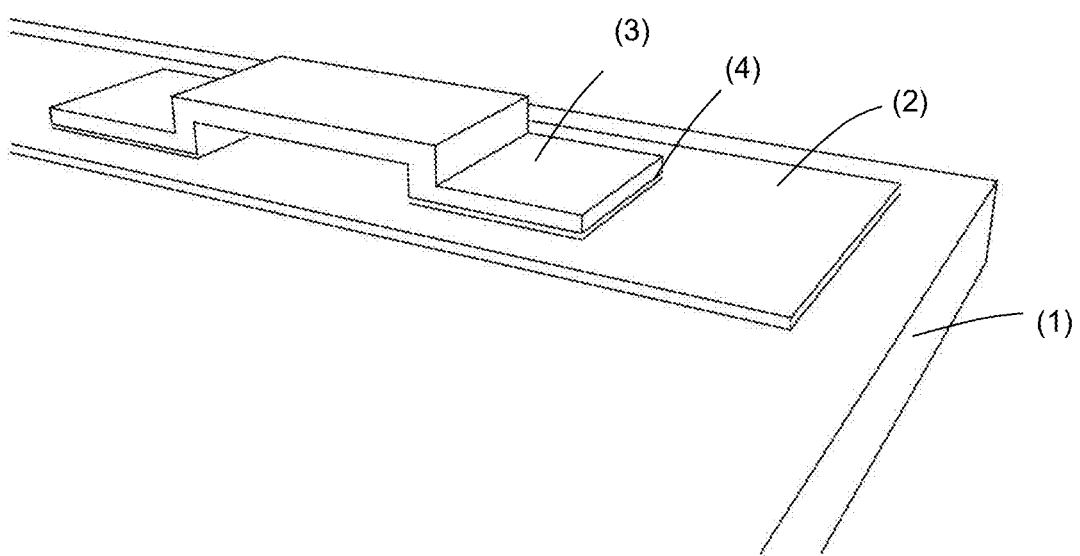

FIG. 11 depicts a perspective representation of the connection element 3 (B) in the form of a bridge. The connection element (B) in the form of a bridge had a width of 4 mm and a length of 24 mm. The contact surfaces 11 of the connection element 3 (B) in the form of a bridge had, in each case, a width of 4 mm and a length of 6 mm. The circular connection element (K) had a radius of 4 mm.

A kovar alloy with a coefficient of thermal expansion α of $5.2 \times 10^{-6}$/° C and an invar alloy with $1.7 \times 10^{-6}$/° C. were assumed as material for the connection elements. The material thickness of the connection elements was, in each case, 0.8 mm. In each case, a glass pane with a material thickness of 2 mm was assumed as the substrate. The material thickness of the solder layer 4 was, in each case, 10 μm.

In the computer simulation, the tensile stresses in the glass pane were calculated with cooling from +20° C to −40° C. The maximum tensile stresses calculated are listed in Table 5.

TABLE 5

| Shape of the Connection Element | Maximum Tensile Stress at −40° C. (MPa) | |
|---|---|---|
| | Kovar (with α = $5.2 \times 10^{-6}$/° C.) | Invar (with α = $1.7 \times 10^{-6}$/° C.) |
| Bridge-shaped (B) | 23.8 | 44.9 |
| Circular (K) | 12.8 | 24.3 |

The maximum tensile stresses depended strongly on the shape of the connection element. As a result, the maximum tensile stresses in the glass pane with circular connection elements (K) made of kovar or invar were, in each case, 46% less than with bridge-shaped connection elements (B) made of kovar or invar, cf. Table 5.

It was demonstrated that panes according to the invention with glass substrates 1 and electrical connection elements 3 according to the invention have better stability against sudden temperature differences.

This result was unexpected and surprising for the person skilled in the art.

LIST OF REFERENCE CHARACTERS (1) pane/glass
(2) electrically conductive structure/Ag screenprint
(3) electrical connection element/Fe—Ni alloy Kovar
(4) solder material (Bi57Sn42Ag1)
(5) wetting layer/Ag coating
(6) compensation member
(7) welding region
(8) connection cable
(9) connecting tab
(10) notch
(11) contact surface of (2) and (3)
(12) portion of (2)
(13) arch
b maximum outflow of the solder material
r radius of curvature
t limiting thickness of the solder material
A-A' section line

The invention claimed is:

1. A pane comprising:
    a glass substrate having a first coefficient of thermal expansion;
    an electrically conductive structure having a layer thickness of 5 μm to 40 μm on a region of the glass substrate;
    a connection element having a second coefficient of thermal expansion, wherein the difference between the first coefficient of thermal expansion and the second coefficient of thermal expansion is higher than $5 \times 10^{-6}/°$ C.;
    a layer of a lead-free solder material electrically connecting the connection element to a portion of the electrically conductive structure,
    wherein the connection element contains at least 55 wt.-% to 70 wt.-% iron, 30 wt.-% to 45 wt.-% nickel, 0 wt.-% to 5 wt.-% cobalt, 0 wt.-% to 1 wt.-% magnesium, 0 wt.-% to 1 wt.-% silicon, or 0 wt.-% to 1 wt.-% carbon, wherein the connection element is connected to the portion of the electrically conductive structure via a contact surface over an entire surface of the connection element, and wherein the contact surface has no corners.

2. The pane according to claim 1, wherein the contact surface has an oval, elliptical or a circular structure.

3. The pane according to claim 1, wherein the contact surface has a convex polygonal shape with rounded corners, the rounded corners having a radius of greater than 0.5 mm.

4. The pane according to claim 1, wherein the solder material flows out from an intermediate space between the connection element and the electrically conductive structure with an outflow width of less than 1 mm.

5. The pane according to claim 1, wherein the solder material contains tin and bismuth, indium, zinc, copper, silver, or compositions thereof.

6. The pane according to claim 5, wherein the tin in the solder composition is 3 wt.-% to 99.5 wt.-%, and the bismuth, indium, zinc, copper, silver, or compositions thereof are each 0.5 wt.-% to 97 wt.-%.

7. The pane according to claim 1, wherein the connection element is coated with nickel, tin, copper, and/or silver.

8. The pane according to claim 7, wherein the connection element is coated with 0.1 μm to 0.3 μm and/or 3 μm to 10 μm silver.

9. The pane according to claim 1, wherein the solder material flows out from an intermediate space between the connection element and the electrically conductive structure with an outflow width of less than 0.5 mm.

10. The pane according to claim 1, wherein the solder material flows out from an intermediate space between the connection element and the electrically conductive structure with an outflow width of about 0 mm.

11. A method for producing a pane, the method comprising:
    disposing and applying lead-free solder material on a connection element as a platelet with a set layer thickness, volume, shape, and configuration;
    applying an electrically conductive structure on a glass substrate;
    disposing the connection element with the solder material on the electrically conductive structure;
    soldering the connection element to the electrically conductive structure; and
    obtaining the pane comprising:
        the glass substrate having a first coefficient of thermal expansion,
        the electrically conductive structure having a layer thickness of 5 μm to 40 μm on a region of the glass substrate,
        the connection element having a second coefficient of thermal expansion, wherein the difference between the first coefficient of thermal expansion and the second coefficient of thermal expansion is higher than $5 \times 10^{-6}/°$ C., and
        a layer of the lead-free solder material electrically connecting the connection element to a portion of the electrically conductive structure,
        wherein the connection element contains at least 55 wt.-% to 70 wt.-% iron, 30 wt.-% to 45 wt.-% nickel, 0 wt.-% to 5 wt.-% cobalt, 0 wt.-% to 1 wt.-% magnesium, 0 wt.-% to 1 wt.-% silicon, or 0 wt.-% to 1 wt.-% carbon, wherein the connection element is connected to the portion of the electrically conductive structure via a contact surface over an entire surface of the connection element, and wherein the contact surface has no corners.

12. A method comprising: using a pane with an electrical connection element as a windshield, rear window, side window, and/or glass roof in vehicles,
    wherein the pane comprises:
        a glass substrate having a first coefficient of thermal expansion;
        an electrically conductive structure having a layer thickness of 5 μm to 40 μm on a region of the glass substrate;
        a connection element having a second coefficient of thermal expansion, wherein the difference between the first coefficient of thermal expansion and the second coefficient of thermal expansion is higher than $5 \times 10^{-6}/°$ C.;
        a layer of a lead-free solder material electrically connecting the connection element to a portion of the electrically conductive structure,
        wherein the connection element contains at least 55 wt.-% to 70 wt.-% iron, 30 wt.-% to 45 wt.-% nickel, 0 wt.-% to 5 wt.-% cobalt, 0 wt.-% to 1 wt.-% magnesium, 0 wt.-% to 1 wt.-% silicon, or 0 wt.-% to 1 wt.-% carbon, wherein the connection element is connected to the portion of the electrically conductive structure via a contact surface over an entire surface of the connection element, and wherein the contact surface has no corners.

* * * * *